(12) United States Patent
Kim et al.

(10) Patent No.: US 8,021,826 B2
(45) Date of Patent: Sep. 20, 2011

(54) COPOLYMER AND COMPOSITION FOR ORGANIC AND ANTIREFLECTIVE LAYER

(75) Inventors: Myung-Woong Kim, Gyeonggi-do (KR); Joo-Hyeon Park, Chungcheongnam-do (KR); Young-Taek Lim, Chungcheongnam-do (KR); Hyung-Gi Kim, Chungcheongnam-do (KR); Jun-Ho Lee, Chungcheongnam-do (KR); Jong-Don Lee, Chungcheongnam-do (KR); Seung-Duk Cho, Chungcheongnam-do (KR)

(73) Assignee: Korea Kumho Petrochemicals Co., Ltd., Seoul (KR)

( * ) Notice: Subject to any disclaimer, the term of this patent is extended or adjusted under 35 U.S.C. 154(b) by 165 days.

(21) Appl. No.: 12/214,430

(22) Filed: Jun. 19, 2008

(65) Prior Publication Data
US 2008/0318167 A1 Dec. 25, 2008

(30) Foreign Application Priority Data

Jun. 25, 2007 (KR) .................. 10-2007-0061981
Apr. 16, 2008 (KR) .................. 10-2008-0034955

(51) Int. Cl.
*G03F 7/11* (2006.01)
*C08F 222/06* (2006.01)
*C08L 37/00* (2006.01)

(52) U.S. Cl. .................. 430/271.1; 430/272.1; 430/319; 430/517; 430/510; 524/549; 524/517; 524/291; 524/158; 524/101; 524/521; 524/300; 524/100; 524/241; 524/114; 526/271; 438/952

(58) Field of Classification Search .......................... None
See application file for complete search history.

(56) References Cited

U.S. PATENT DOCUMENTS

| | | | | |
|---|---|---|---|---|
| 3,238,168 A * | 3/1966 | Wolff et al. | .................. | 524/833 |
| 3,247,288 A * | 4/1966 | Masters et al. | .................. | 525/114 |
| 4,307,007 A * | 12/1981 | Brodoway | .................. | 524/139 |
| 4,508,885 A * | 4/1985 | Nishiwaki et al. | .................. | 526/318 |
| 6,114,085 A | 9/2000 | Padmanaban et al. | | |
| 6,165,684 A | 12/2000 | Mizutani et al. | | |
| 6,277,750 B1 | 8/2001 | Pawlowski et al. | | |
| 6,329,117 B1 | 12/2001 | Padmanaban et al. | | |
| 6,399,269 B2 | 6/2002 | Mizutani et al. | | |
| 6,808,869 B1 | 10/2004 | Mizutani et al. | | |
| 7,038,328 B2 | 5/2006 | Enomoto et al. | | |
| 7,365,115 B2 | 4/2008 | Akiyama et al. | | |
| 2004/0171502 A1 * | 9/2004 | Clark et al. | .................. | 510/175 |
| 2005/0250913 A1 * | 11/2005 | Masuda et al. | .................. | 525/374 |

FOREIGN PATENT DOCUMENTS

KR 10-2004-014417 A * 12/2004

OTHER PUBLICATIONS

English abstract of Korean Patent Publication No. 10:2004 0104417 published on Dec. 10, 2004, one page from Korean Intellectual Propery Office.*

* cited by examiner

*Primary Examiner* — Cynthia Hamilton
(74) *Attorney, Agent, or Firm* — Davidson, Davidson & Kappel, LLC

(57) ABSTRACT

The present invention provides an organic anti-reflection coating composition comprising a copolymer represented by the following Formula 1, a light absorbent, a thermal acid generating agent, and a curing agent:

[Formula 1]

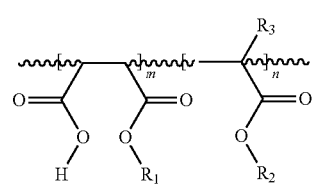

wherein $R_1$, $R_2$ and $R_3$ are each independent to each; $R_1$ represents hydrogen or an alkyl group having 1 to 10 carbon atoms; $R_2$ represents hydrogen, an alkyl group having 1 to 10 carbon atoms or an arylalkyl group having 1 to 20 carbon atoms; $R_3$ is hydrogen or a methyl group; m and n are repeating units in the main chain, while m+n=1, and they have values of $0.05<m/(m+n)<0.95$ and $0.05<n/(m+n)<0.95$. The anti-reflection coating using the polymer of the invention has excellent adhesiveness and storage stability, and a very high dry etching rate, and exhibits excellent resolution in both C/H patterns and L/S patterns.

11 Claims, 1 Drawing Sheet

COPOLYMER AND COMPOSITION FOR ORGANIC AND ANTIREFLECTIVE LAYER

CROSS REFERENCE TO RELATED APPLICATION

This application claims priority under 35 U.S. §119 from Korean Patent Application 10-2007-0061981, filed on Jun. 25, 2007, and Korean Patent Application 10-2008-0034955, filed on Jun. 25, 2007 the contents of which are hereby incorporated by reference in their entirety for all purposes as if fully set forth herein.

BACKGROUND OF THE INVENTION

1. Technical Field

The present invention relates to an organic anti-reflection coating composition for preventing reflection at the undercoat layer and preventing standing wave during a lithography process, and having a high dry etching rate. More particularly, the invention relates to a novel polymer which can be used in the production of an organic anti-reflection coating that is useful for semiconductor ultrafine patterning using an ArF excimer laser, a light absorbent, and an organic anti-reflection coating composition containing these.

The present invention also relates to a method for patterning of semiconductor devices using the organic anti-reflection coating composition.

2. Description of the Related Art

The recent high integration of semiconductor devices has led to a demand for ultrafine patterns with a line width of 0.10 micrometers or less in the production of ultra-LSI and the like, and a lithography process using light having a smaller wavelength than the conventionally used light for exposure having a wavelength in the region of g-ray or i-ray, is also demanded. Thus, microlithography processes using KrF excimer laser or ArF excimer laser are currently used in the processes for producing semiconductor devices.

As the size of the pattern of semiconductor devices is ever decreasing, only when the reflection rate is maintained to be less than 1% at maximum during the progress of the exposure process, uniform pattern can be obtained, an adequate process margin can be obtained, and a desired yield can be achieved. Therefore, a technology of disposing underneath a photoresist, an organic anti-reflection coating containing organic molecules which are capable of absorbing light, in order to reduce the reflection rate as far as possible, and thereby regulating the reflection rate to prevent reflection at the undercoat layer and to remove standing wave, has become important.

Accordingly, the organic anti-reflection coating composition should satisfy the following requirements.

First, the organic anti-reflection coating composition should contain a material which is capable of absorbing light in the region of the wavelength of the exposure light source, in order to prevent reflection at the undercoat layer. Secondly, the anti-reflection coating should not be solubilized and destroyed by the solvent of a photoresist during the process of laminating the anti-reflection coating and then laminating a photoresist. For this, the anti-reflection coating must be designed to have a thermally curable structure, and curing should be accelerated by carrying out a baking process after coating in the process for laminating anti-reflection coating. Thirdly, the anti-reflection coating should be able to be etched faster than the photoresist in the upper part, so as to reduce a loss of the photoresist resulting from etching of the undercoat layer. Fourthly, the anti-reflection coating composition should not be reactive to the photoresist in the upper part. Also, compounds such as amine or acid should migrate to the photoresist layer, because these compounds may cause deformation in the photoresist pattern, such as footing or undercoat in particular. Fifthly, the anti-reflection coating composition should have optical properties that are appropriate for various exposure processes in accordance with various substrates, that is, an appropriate refractive index and an absorption coefficient, and also should have good adhesiveness to the substrate and the photoresist.

However, under the current situation, an anti-reflection coating which is satisfactory in the process for ultrafine patterning using ArF light, has not been developed so far. Therefore, in order to prevent standing wave and reflection generated upon exposure, and to eliminate the back-diffraction at the undercoat layer and the influence of reflected light, development of an organic anti-reflection material having large absorption for a specific wavelength is considered as an urgent problem to be solved.

SUMMARY OF THE INVENTION

Accordingly, an embodiment of the invention provides an organic anti-reflection coating composition capable of absorbing a reflected light generated upon exposure during an ultrafine patterning lithography process using an ArF excimer laser having a wavelength of 193 nm.

Also, another embodiment of the invention provides to design the fundamental structure of the anti-reflection coating to be a chemical structure capable of accelerating the etching rate of the organic anti-reflection coating, to produce a polymer based on the structure, and to provide a method for producing an organic anti-reflection coating based on the polymer, thereby facilitating the etching process.

Also, another embodiment of the invention provides a method for patterning of semiconductor devices using the organic anti-reflection coating composition, which method is capable of eliminating undercut, footing or the like, and achieving excellent ultrafine patterning.

According to embodiments of the invention, the organic anti-reflection coating formed using a novel copolymer for organic anti-reflection coating and a light absorbent can provide general resistance to solvent, and control of the phenomenon of light interference, as well as a high etching rate.

Therefore, an excellent process margin is provided for an ultrafine patterning process using a light source at 193 nm, and thus an excellent pattern profile can be obtained regardless of the type of substrate. Also, contribution can be made to more active development of highly integrated semiconductor devices using the industrial benefits obtainable by rapidly etching the anti-reflection coating.

BRIEF DESCRIPTION OF THE DRAWINGS

The above and other features of some embodiments of the invention will become readily apparent from the description that follows, with reference to the attached drawings in which.

DETAILED DESCRIPTION

Figure 1:
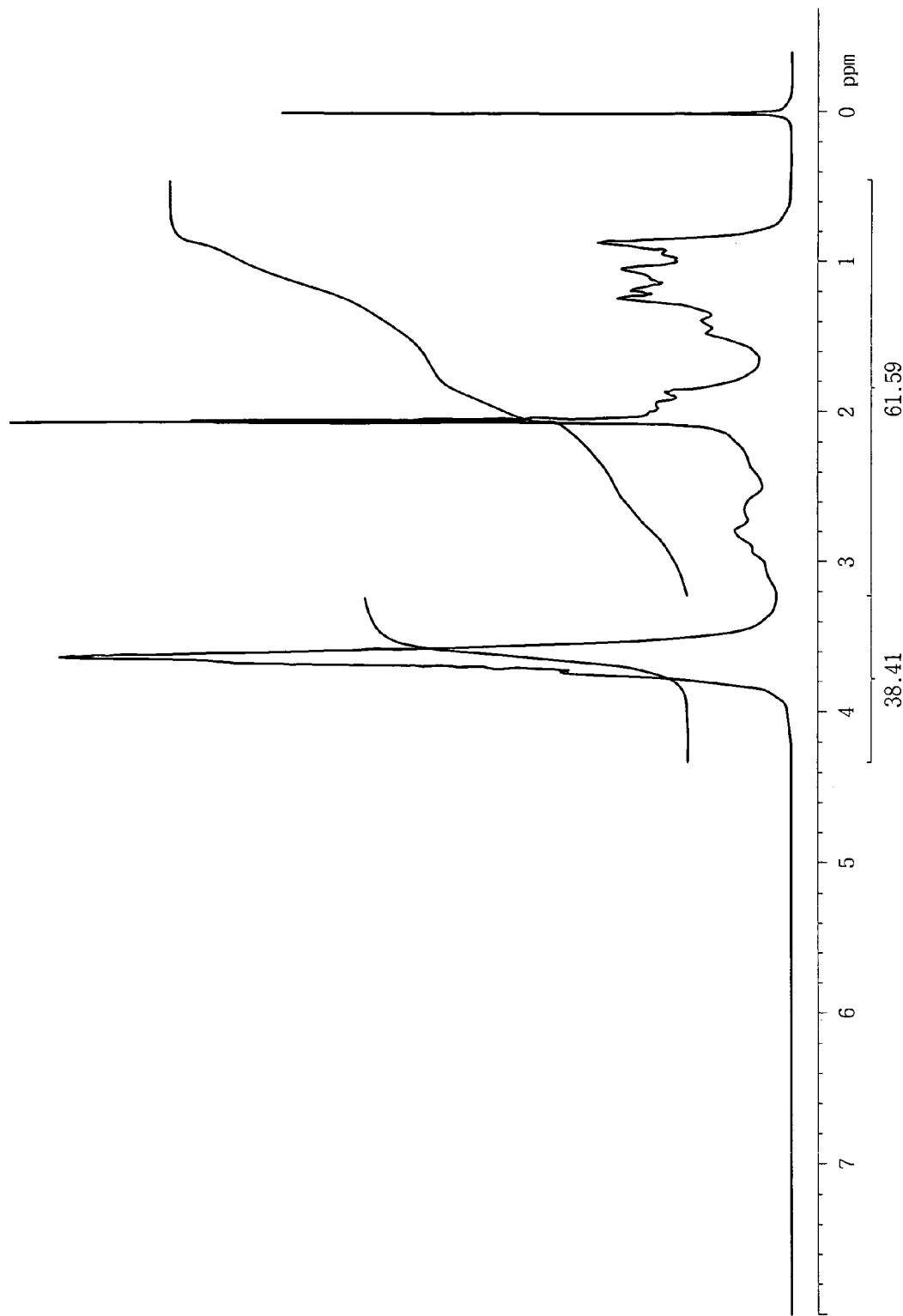
FIG. 1 is a $^1$H-NMR spectrum of a copolymer produced according to Synthesis Example 1.

To overcome such problems as described above, an object of the present invention is to provide a novel polymer which can be used as an organic anti-reflection coating capable of absorbing a reflected light generated upon exposure during an ultrafine patterning lithography process using an ArF excimer laser having a wavelength of 193 nm, a light absorbent, and an organic anti-reflection coating composition containing the materials.

It is another object of the invention to design the fundamental structure of the anti-reflection coating to be a chemical structure capable of accelerating the etching rate of the organic anti-reflection coating, to produce a polymer based on the structure, and to provide a method for producing an organic anti-reflection coating based on the polymer, thereby facilitating the etching process. Also, another object of the invention is to provide a method for patterning of semiconductor devices using the organic anti-reflection coating composition, which method is capable of eliminating undercut, footing or the like, and achieving excellent ultrafine patterning.

Under the purpose of achieving the objects as described above, the organic anti-reflection coating composition of the present invention comprises a copolymer for organic anti-reflection coating, a light absorbent, a thermal acid generating agent, and a curing agent. The organic anti-reflection coating composition also comprises an organic solvent, and may further contain surfactants and various additives.

The method for patterning of semiconductor devices of the present invention comprises the steps of coating the organic anti-reflection coating composition on top of a layer to be etched, curing the coated composition through a baking process, and forming cross-linking bonds to form an organic anti-reflection coating.

The copolymer for organic anti-reflection coating is represented by the following formula 1.

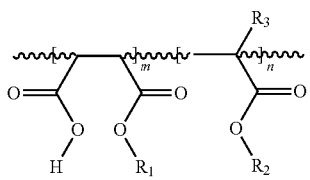

[Formula 1]

wherein $R_1$, $R_2$ and $R_3$ are independent to each other, and $R_1$ represents hydrogen or an alkyl group having 1 to 10 carbon atoms, $R_2$ represents hydrogen, an alkyl group having 1 to 10 carbon atoms or an arylalkyl group having 1 to 20 carbon atoms while $R_3$ represents hydrogen or a methyl group; m and n represent repeating units in the main chain, while m+n=1, and they satisfy the expressions $0.05<m/(m+n)<0.95$ and $0.05<n/(m+n)<0.95$.

In general, an anti-reflection coating can be designed to have a structure in various forms. In one case, a light absorbent which is a chemical species capable of light absorption is contained in the main chain of the polymer, and in another case, two different chemical species, namely, a light absorbent and a polymer curing agent which is incapable of light absorption, are separately used. Generally, the light absorbent is often separately used so that the amount of the chemical species for light absorption can be controlled.

As general polymeric curing agents, polymers containing a hydroxyl functional group, a glycidyl functional group, an acetal functional group and the like are frequently used.

In the present invention, the copolymer represented by the above formula 1, which has a carboxylic acid functional group introduced to enable thermal curing, and contains maleic anhydride known to have a high etching rate, is used as the polymeric curing agent, together with the compound capable of light absorption. The polymer can be produced by polymerizing maleic anhydride and an alkyl acrylate-based compound to produce a polymer of the following formula 2, and then reacting the reaction intermediate of formula 2 obtained from the polymerization reaction, with an alkyl alcohol having 1 to 10 carbon atoms.

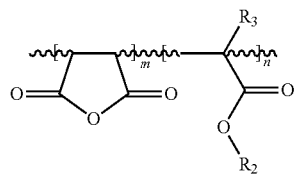

[Formula 2]

wherein $R_2$ and $R_3$ are each independent, $R_2$ is hydrogen, an alkyl group having 1 to 10 carbon atoms or an arylalkyl group having 1 to 20 carbon atoms; $R_3$ is hydrogen or a methyl group; m and n are repeating units in the main chain, while m+n=1, and they satisfy the expressions $0.05<m/(m+n)<0.95$ and $0.05<n/(m+n)<0.95$.

As for the alkyl acrylate-based compound, one selected from the group consisting of methyl acrylate, ethyl acrylate, isopropyl acrylate, normal propyl acrylate, normal butyl acrylate, isobutyl acrylate, tert-butyl acrylate, cyclohexyl acrylate, isobornyl acrylate, 2-ethylhexyl acrylate, methyl methacrylate, ethyl methacrylate, isopropyl methacrylate, normal propyl methacrylate, tert-butyl methacrylate, normal butyl methacrylate, isobutyl methacrylate, cyclohexyl methacrylate, isobornyl methacrylate, 2-ethylhexyl methacrylate, is used.

The carboxylic acid functional group generated by subjecting the reaction intermediate compound of formula 2 to ring-opening with an alkyl alcohol, is reacted with a curing agent having an acetal functional group or the like, to form a cross-linked structure.

The anti-reflection coating employing this polymer undergoes curing during the baking process after the coating on a substrate, and attains resistance to dissolution in solvents. This is to impart stability so that a phenomenon in which the anti-reflection coating is not dissolved in the solvent of photosensitizer during the coating of a photosensitizer after the lamination of the anti-reflection coating, and the polymer can be preferably used as a polymeric curing agent in the organic anti-reflection coating composition.

The polymer can be polymerized by any conventional method, but radical polymerization is preferred. The radical polymerization initiator is not particularly limited, as long as it is used as a general radical polymerization initiator, such as azobisisobutyronitrile, benzoyl peroxide, lauryl peroxide, azobisisocapronitrile, azobisisovaleronitrile, or t-butyl hydroperoxide.

The polymerization can be conducted by a method of bulk polymerization, solution polymerization, suspension polymerization, bulk suspension polymerization, emulsion polymerization or the like, and for the polymerization solvent, at least one selected from benzene, toluene, xylene, halogenated benzene, diethyl ether, tetrahydrofuran, esters, ethers, lactones, ketones and amides is used.

The polymerization temperature for the polymer is appropriately selected and used in accordance with the type of initiator.

The molecular weight distribution of the polymer can be appropriately controlled by changing the amount of use of the polymerization initiator and the reaction time. After completion of the polymerization, it is preferable to remove any unreacted monomer and side products remaining in the reaction mixture, by precipitation in solvent.

To control the molecular weight, since it is usually difficult to obtain the molecular weight through gel permeation chromatography (GPC) in the case where ring-opened maleic anhydride is contained, reference should be made to the molecular weight of the polymer of the above formula 2, which is the polymer before the ring-opening with an alcohol having 1 to 10 carbon atoms. That is, the weight average molecular weight, measured by gel permeation chromatography and normalized with respect to polystyrene, of the reaction intermediate represented by the formula 2, which is the polymer before ring-opening, is typically 1,000 to 100,000, and is preferably 5,000 to 50,000 from the viewpoints of solubility in solvents, coatability, sufficient cross-linking bonding, and the like. The polydispersity index (PDI) of the polymer is preferably 1.0 to 5.0, and particularly preferably 1.5 to 3.5.

Specific examples of the polymer represented by the formula 1 according to the present invention include, but not limited to, the following polymers having the structures of the following formulas 3 to 7.

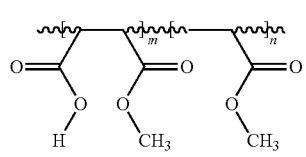

[Formula 3]

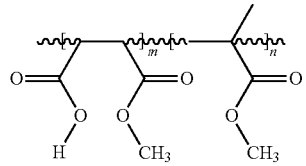

[Formula 4]

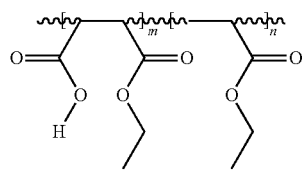

[Formula 5]

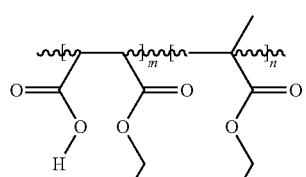

[Formula 6]

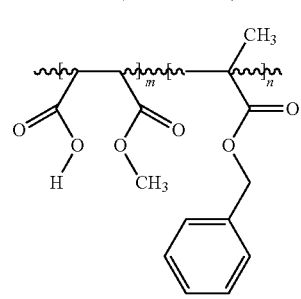

[Formula 7]

wherein m and n are repeating units in the main chain, while m+n=1, and they satisfy the expressions $0.05<m/(m+n)<0.95$ and $0.05<n/(m+n)<0.95$.

The light absorbent is contained in the composition to provide an organic anti-reflection coating having a high etching rate, and is represented by the following formula 8.

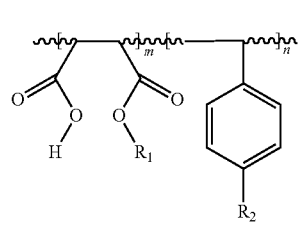

[Formula 8]

wherein $R_1$ is an alkyl group having 1 to 10 carbon atoms, $R_2$ is hydrogen, an hydroxyl or an alkyl group having 1 to 10 carbon atoms; m and n are repeating units in the main chain, while m+n=1, and they satisfy the expressions $0.05<m/(m+n)<0.95$ and $0.05<n/(m+n)<0.95$.

The above polymer can be produced by polymerizing maleic anhydride and a styrene compound to produce a polymer of the following formula 9, and then reacting the resulting polymer obtained from the polymerization reaction, with an alkyl alcohol having 1 to 10 carbon atoms.

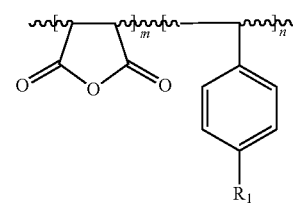

[Formula 9]

wherein $R_1$ represents hydrogen, hydroxyl group or an alkyl group having 1 to 10 carbon atoms; m and n are repeating units in the main chain, while m+n=1, and they satisfy the expressions $0.05<m/(m+n)<0.95$ and $0.05<n/(m+n)<0.95$.

The polymer of the formula 8 allows the carboxylic acid functional group generated from the ring-opening of maleic anhydride using an alkyl alcohol, to react with a curing agent having a functional group such as acetal, to thus form a cross-linked structure. An anti-reflection coating employing this polymer undergoes curing during the baking process after the coating on a substrate, and attains resistance to dissolution in solvents. Thus, no problem arises during the coating of a photosensitizer after the lamination of the anti-reflection coating.

Furthermore, since the above polymer contains a chromophore having high absorption so that the polymer can absorb light having a wavelength of 193 nm, the polymer of the above formula 1 can be preferably used as a light absorbent in the organic anti-reflection coating composition with regard to a light source at 193 nm. Also, since the polymer contains a large quantity of oxygen atoms, an organic anti-reflection coating composition having a high etching rate can be produced.

The light absorbent can be polymerized by a conventional method, but radical polymerization is preferred. The radical polymerization initiator is not particularly limited as long as it is used as a general radical polymerization initiator, such as azobisisobutyronitrile, benzoyl peroxide, lauryl peroxide, azobisisocapronitrile, azobisisovaleronitrile, or t-butyl hydroperoxide.

The polymerization can be conducted by a method of bulk polymerization, solution polymerization, suspension polymerization, bulk suspension polymerization, emulsion polymerization or the like, and for the polymerization solvent, at least one selected from benzene, toluene, xylene, halogenated benzene, diethyl ether, tetrahydrofuran, esters, ethers, lactones, ketones and amides, is used.

The polymerization temperature for the polymer is appropriately selected and used in accordance with the type of initiator. The molecular weight distribution of the polymer can be appropriately controlled by changing the amount of use of the polymerization initiator and the reaction time. After completion of the polymerization, it is preferable to remove any unreacted monomer and side products remaining in the reaction mixture, by precipitation in solvent.

To control the molecular weight, since it is usually difficult to obtain the molecular weight through gel permeation chromatography (GPC) in the case where ring-opened maleic anhydride is contained, reference should be made to the molecular weight of the polymer of the above formula 2, which is the polymer before the ring-opening with an alcohol having 1 to 10 carbon atoms. Typically, the weight average molecular weight, measured by gel permeation chromatography and normalized with respect to polystyrene, of the light absorbent before ring-opening is preferably 1,000 to 100,000.

As for the light absorbent of formula 8, one selected from the polymers having the following formulas 10 to 13 may be used.

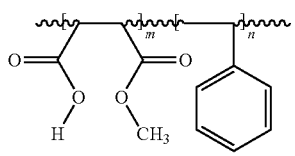

[Formula 10]

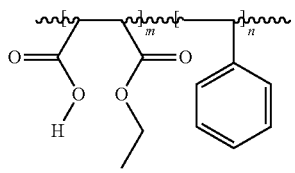

[Formula 11]

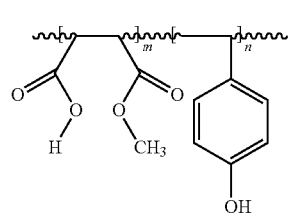

[Formula 12]

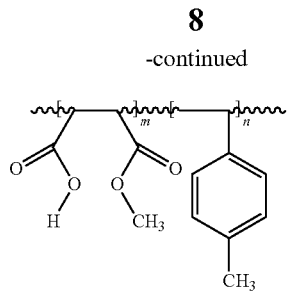

[Formula 13]

wherein m and n are repeating units in the main chain, while m+n=1, and they satisfy the expressions $0.05<m/(m+n)<0.95$ and $0.05<n/(m+n)<0.95$.

Meanwhile, as light absorbent used in the invention, a compound having the following formula 14, 19 or 20 can also be used to provide an organic anti-reflection coating having a high etching rate.

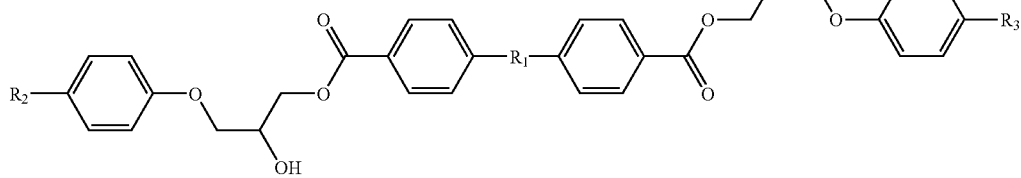

[Formula 14]

wherein $R_1$ is selected among

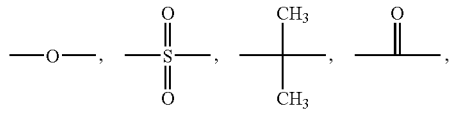

$R_2$ and $R_3$ represent each independent hydrogen, an alkyl group having 1~10 of carbon atoms or alkoxy group having 1~10 of carbon atoms.

The compound of the formula 14 contains two hydroxyl groups per compound, and thus can form a cross-linked structure when used together with a curing agent containing a functional group such as epoxy or acetal. An anti-reflection coating employing this compound undergoes curing during the baking process after the coating on a substrate, and attains resistance to dissolution in solvents. Thus, no problem arises during the coating of a photosensitizer after the lamination of the anti-reflection coating. Furthermore, since the above polymer contains a chromophore having high absorption so that the polymer can absorb light having a wavelength of 193 nm, the polymer of the above formula 14 can be preferably used as a light absorbent in the organic anti-reflection coating composition with regard to a light source at 193 nm. Also, since the polymer contains a large quantity of oxygen atoms, an organic anti-reflection coating composition having a high etching rate can be produced. The above compound can be obtained by reacting phenyl derivatives with dicarboxyl group with 1,2-epoxy-3-phenoxy-propane in the presence of a basic catalyst.

Furthermore, as an light absorbent used in the invention, a compound having the following formula 15 to 18 can also be used to provide an organic anti-reflection coating having a high etching rate.

coating employing this compound undergoes curing during the baking process after the coating on a substrate, and attains resistance to dissolution in solvents. Thus, no problem arises during the coating of a photosensitizer after the lamination of

[Formula 15]

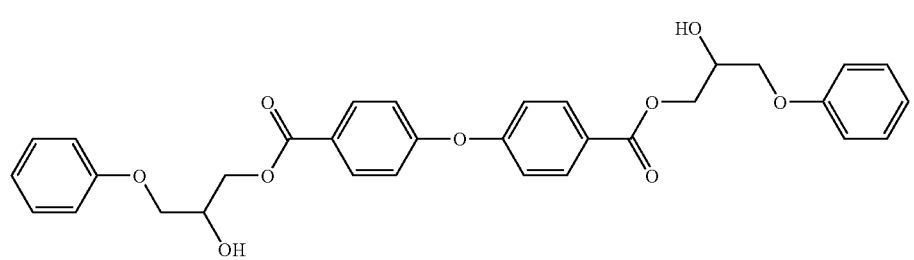

[Formula 16]

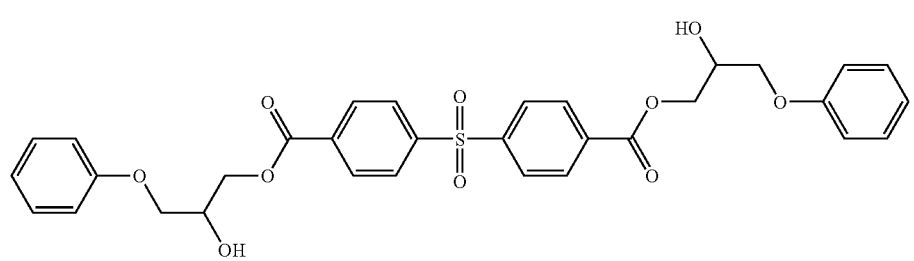

[Formula 17]

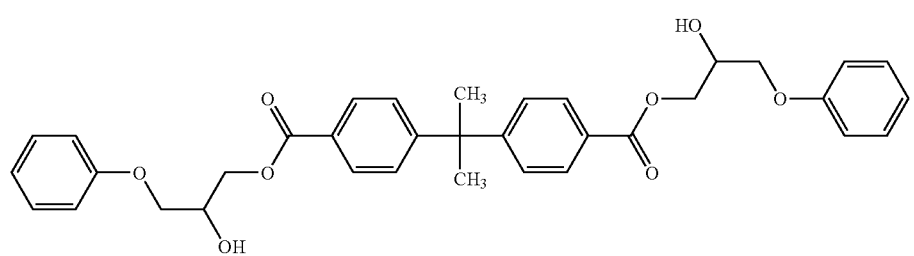

[Formula 18]

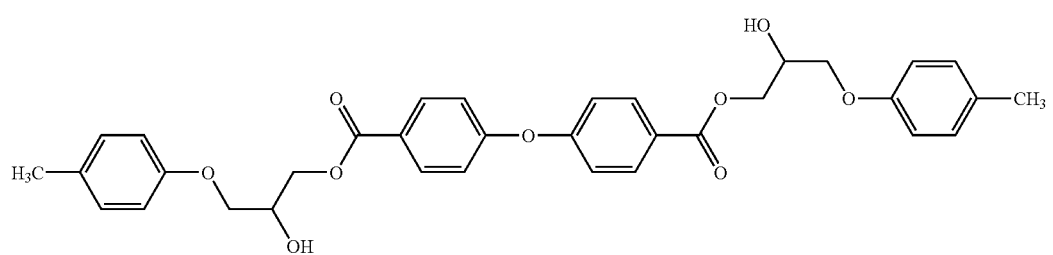

[Formula 19]

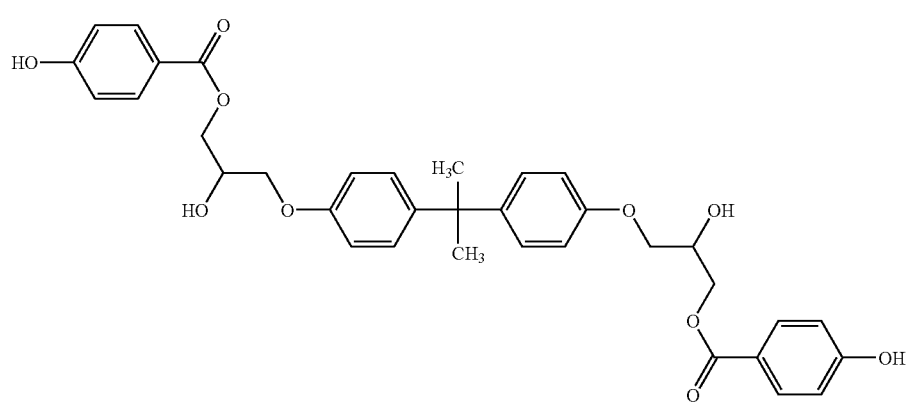

The compound of the formula 19 contains four hydroxyl groups per compound, and thus can form a cross-linked structure when used together with a curing agent containing a functional group such as epoxy or acetal. An anti-reflection the anti-reflection coating. Furthermore, since the above polymer contains a chromophore having high absorption so that the polymer can absorb light having a wavelength of 193 nm, the polymer of the above formula 19 can be preferably used as a light absorbent in the organic anti-reflection coating composition with regard to a light source at 193 nm. Also, since the polymer contains large quantities of oxygen atoms and nitrogen atoms, an organic anti-reflection coating composition having a high etching rate can be produced. The above compound can be obtained by reacting bisphenol A diglycidyl ether with 4-hydroxybenzoic acid in the presence of a basic catalyst.

hydrogen atom on the amino group of a glycoluril compound, a urea compound, benzoguanamine compound, or a melamine compound. Specific examples thereof include hexamethoxymethylmelaine, tetramethoxymethylbenzoguanamine, 1,3,4,6-tetrakis(butoxymethyl)glycoluril, 1,3-bis (hydroxymethyl)-4,5-dihydroxy-2-imidazolinone, 1,3-bis (methoxymethyl)-4,5-dimethoxy-2-imidazolinone and the like. Examples of commercially available products include

[Formula 20]

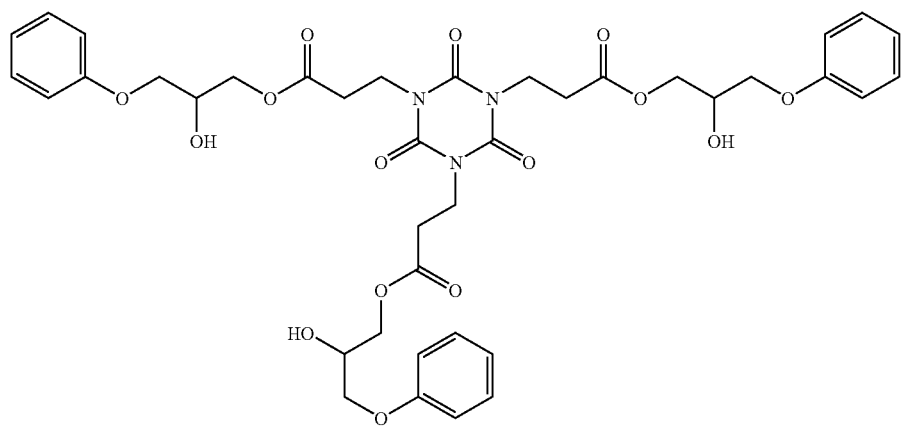

The compound of the formula 20 contains 3 hydroxyl groups per compound, and thus can form a cross-linked structure when used together with a curing agent containing a functional group such as epoxy or acetal. An anti-reflection coating employing this compound undergoes curing during the baking process after the coating on a substrate, and attains resistance to dissolution in solvents. Thus, no problem arises during the coating of a photosensitizer after the lamination of the anti-reflection coating. Furthermore, since the above polymer contains a chromophore having high absorption so that the polymer can absorb light having a wavelength of 193 nm, the polymer of the above formula 20 can be preferably used as a light absorbent in the organic anti-reflection coating composition with regard to a light source at 193 nm. Also, since the polymer contains large quantities of oxygen atoms and nitrogen atoms, an organic anti-reflection coating composition having a high etching rate can be produced. The above compound can be obtained by reacting tris(2-carboxyethyl)isocyanurate with 1,2-epoxy-3-phenoxypropane in the presence of a basic catalyst.

Various compounds may be used as the additives for helping curing and performance improvement of the polymer for organic anti-reflection coating and the light absorbent. A curing agent may be mentioned as a first example of the additives, and a compound at least having two or more cross-linkable functional groups per compound, and having a functional group which can react with the carboxylic acid functional group of the polymer for anti-reflection coating and the carboxylic acid functional group of the light absorbent, or with a hydroxyl group, should be used as the curing agent. For example, aminoplastic compounds, polyfunctional epoxy resins, anhydrides and mixtures thereof may be mentioned. The cross-linkable functional group is selected from the group consisting of a methylol group, an alkoxymethyl group, an oxetanyl group, an oxazoline group, a cyclocarbonate group, an alkoxysilyl group, an aziridinyl group, an isocyanate group, an alkoxymethylamino group, aminomethylol group, and a polyfunctional epoxy group, all substituting the methoxymethyl type melamine compounds such as Cymel 300, Cymel 301 and Cymel 350; butoxymethyl type melamine compounds such as Mycoat 506 and Mycoat 508; glycoluril compounds such as Cymel 1170 and Powderlink 1174; butylated urea resins such as URF300, U-VAN10R and U-VAN11HV; urea/formaldehyde-based resins such as Bekamin J-300S, Bekamin P-955 and Bekamin N, and analogous products thereof. As for the polyfunctional epoxy compounds, products under the trade names of MY720, CY179MA and DENACOL, and analogous products are preferred.

As a second example of the additives, a thermal acid generating agent is used as a catalyst for accelerating the curing reaction.

It is preferable to use a compound represented by the following formula 21 or 23 as the thermal acid generating agent. Since the compound represented by the following formula 21 to 23 shows a good curing efficiency when used together with curing agents having the above-mentioned various functional groups, the compound has properties appropriate for the anti-reflection coating composition for which the heating time for curing is limited to less than 5 minutes.

[Formula 21]

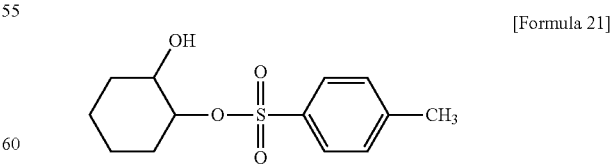

[Formula 22]

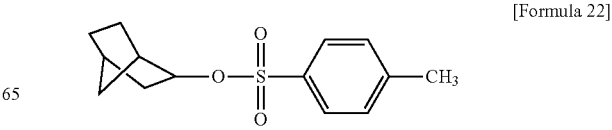

[Formula 23]

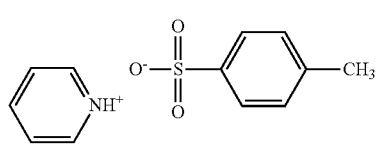

Moreover, as for the organic solvent that can be used in the organic anti-reflection coating composition of the present invention, at least one solvent selected from the group consisting of propylene glycol monomethyl ether (PGME), propylene glycol monomethyl ether acetate (PGMEA), cyclohexanone, ethyl lactate, propylene glycol n-propyl ether, dimethylformamide (DMF), gamma-butyrolactone, ethoxyethanol, methoxyethanol, methyl 3-methoxypropionate (MMP), and ethyl 3-ethoxypropionate (EEP), is preferably used.

In the organic anti-reflection coating composition according to the present invention, the polymer of the formula 1 which is used as the polymer for organic anti-reflection coating, is preferably contained in an amount of 0.1 to 40% by weight in the total anti-reflection coating composition, and the light absorbent is preferably contained in an amount of 0.1 to 40% by weight in the total anti-reflection coating composition. The curing agent is preferably contained in an amount of 0.01 to 40% by weight in the total anti-reflection coating composition, and the thermal acid generating agent is preferably contained in an amount of 0.01 to 20% by weight in the total anti-reflection coating composition.

When the organic anti-reflection coating composition containing the above-mentioned components at the above compositional ratios is coated on a wafer, and then a thermal process such as baking is performed, acid is generated from the thermal acid generating agent, and in the presence of the generated acid, a cross-linking reaction occurring between the hydroxyl group of the polymer for organic anti-reflection coating of formula 1 and the light absorbent, and the curing agent used as an additive, is promoted. Thus, an organic anti-reflection coating which is not soluble in the solvent of photoresist is formed.

Such organic anti-reflection coating absorbs the far-ultraviolet rays which have transmitted the photoresist and reached the anti-reflection coating, thus preventing diffuse reflection at the photoresist undercoat.

In the processes for the organic anti-reflection coating according to the present invention, the baking process is performed at 80 to 250° C., and the baking time is selected to be 20 seconds to 60 minutes. Preferably, the baking process is performed at a temperature of 150 to 250° C. for 1 to 5 minutes.

Furthermore, the processes after obtaining the organic anti-reflection coating correspond to the conventional processes for patterning of semiconductor devices, and thus are not particularly limited.

Also, in the patterning method of the present invention, a second baking process can be additionally performed before or after exposure during the step of forming a photoresist pattern, and such second baking process is preferably performed at a temperature of 70 to 200° C.

Hereinafter, the present invention will be specifically explained by way of preferred synthesis examples and embodiment examples. However, these examples are suggested only for illustrative purposes, and are not intended to limit the scope of the invention.

SYNTHESIS EXAMPLE 1

Synthesis of Polymer for Organic Anti-Reflection Coating A 29.4 g of maleic anhydride, 30 g of methyl methacrylate, and 2.97 g of AIBN were dissolved in 120 g of 1,4-dioxane, and then the mixture was subjected to a polymerization reaction at 70° C. for 12 hours. After completion of the reaction, the reaction solution was added dropwise to methyl alcohol, and a precipitate thus generated was filtered, washed several times with methyl alcohol, and vacuum dried (Mw=17,200, PDI=2.95, yield=58%). 72 g of the vacuum dried polymer and 0.55 g of toluenesulfonic acid monohydrate were mixed with 725 g of methyl alcohol, and then the mixture was allowed to react at 70° C. for 48 hours. After completion of the reaction, the reaction solution was added dropwise to distilled water, and a precipitate thus obtained was filtered, washed several times with distilled water, and vacuum dried (yield=58%).

SYNTHESIS EXAMPLE 2

Synthesis of Polymer for Organic Anti-Reflection Coating B 56.5 g of maleic anhydride, 100 g of benzyl methacrylate, and 4.67 g of AIBN were dissolved in 480.94 g of 1,4-dioxane, and then the mixture was subjected to a polymerization reaction at 80° C. for 20 hours. After completion of the reaction, the reaction solution was added dropwise to methyl alcohol, and a precipitate thus generated was filtered, washed several times with methyl alcohol, and vacuum dried (Mw=17,200, PDI=2.95, yield=53%). 82.95 g of the vacuum dried polymer and 4.23 g of toluenesulfonic acid monohydrate were mixed with 1200 g of methyl alcohol, and then the mixture was allowed to react at 80° C. for 48 hours. After completion of the reaction, the reaction solution was added dropwise to distilled water, and a precipitate thus obtained was filtered, washed several times with distilled water, and vacuum dried (yield=53%).

SYNTHESIS EXAMPLE 3

Synthesis of Light Absorbent A 100 g of a styrene-maleic anhydride polymer (Mn=1,600, mole number of styrene:mole number of maleic anhydride=1.3:1) purchased from Sigma-Aldrich Company, Inc., and 0.77 g of toluenesulfonic acid monohydrate were mixed with 1000 g of methyl alcohol, and the mixture was allowed to react at 70° C. for 48 hours. After completion of the reaction, the reaction solution was added dropwise to distilled water, and a precipitate thus generated was filtered, washed several times with distilled water, and vacuum dried (yield=104%).

SYNTHESIS EXAMPLE 4

Synthesis of Light Absorbent B 21.80 g of Bisphenol A diglycidyl ether, 17.69 g of 4-hydroxybenzoic acid and 0.37 g of triethylamine were dissolved in 78.98 g of propylene glycol monomethyl ether acetate, and then the mixture was allowed to react at 120° C. for 18 hours.

After completion of the reaction, the reaction solution was cooled to ambient temperature, and transferred to a container.

SYNTHESIS EXAMPLE 5

Synthesis of Light Absorbent C 200 g of tris(2-carboxyethyl)isocyanurate, 260.9 g of 1,2-epoxy-3-phenoxypropane, and 3.52 g of triethylamine were mixed with 928.8 g of 1,4-dioxane, and then the mixture was allowed to react at 120° C. for 18 hours. After completion of the reaction, the solvent was removed in an evaporator, and the residue was dissolved in methylene chloride, and washed several times with a 2% aqueous solution of hydrochloric acid and distilled water. The solvent was removed using an evaporator, to obtain the reaction product.

SYNTHESIS EXAMPLE 6

Synthesis of Light Absorbent D 100 g of 4,4'-oxybisbenzoic acid, 116.31 g of 1,2-epoxy-3-phenoxypropane, and 6.24 g of tetrabutylammonium bromide were mixed with 457.58 g of propylene glycol monomethyl ether acetate, and then the mixture was allowed to react at 120° C. for 18 hours. After completion of the reaction, the reaction solution was cooled to ambient temperature, and transferred to a container.

SYNTHESIS EXAMPLE 7

Synthesis of Light Absorbent E 50 g of sulfonyldibenzoic acid, 49.03 g of 1,2-epoxy-3-phenoxypropane, and 5.26 g of tetrabutylammonium bromide were mixed with 208.58 g of dimethylformamide, and then the mixture was allowed to react at 120° C. for 18 hours. After completion of the reaction, the reaction solution was cooled to ambient temperature. The solid was made by hexane and distilled water and washed several times with distilled water. The water was removed using vacuum oven to obtain the reaction product.

EXAMPLE 1

Production of Organic Anti-Reflection Coating Composition A 7 g of the polymer for organic anti-reflection coating produced in the above Synthesis Example 1, 6 g of the light absorbent A produced in the above Synthesis Example 3, 2 g of tetramethoxymethylglycoluril, and 1 g of a thermal acid generating agent having the structure of Formula 23 were dissolved in 984 g of propylene glycol monomethyl ether acetate, and then the solution was filtered through a membrane filter having a diameter of 0.2 µm, to thus produce the organic anti-reflection coating composition A.

EXAMPLE 2

Production of Organic Anti-Reflection Coating Composition B 7 g of the polymer for organic anti-reflection coating produced in the Synthesis Example 1, 8 g of the light absorbent B produced in the Synthesis Example 3, 2.1 g of tetramethoxymethylglycoluril, and 1 g of a thermal acid generating agent having the structure of Formula 23 were dissolved in 981.9 g of ethyl lactate, and then the solution was dissolved through a membrane filter having a diameter of 0.2 µm, to thus produce the organic anti-reflection coating composition B.

EXAMPLE 3

Production of Organic Anti-Reflection Coating Composition C 8 g of the polymer for organic anti-reflection coating produced in the Synthesis Example 1, 10 g of the light absorbent B produced in the Synthesis Example 4, 2.7 g of tetramethoxymethylglycoluril, and 0.54 g of a thermal acid generating agent having the structure of Formula 23 were dissolved in 978.76 g of propylene glycol monomethyl ether acetate, and then the solution was filtered through a membrane filter having a diameter of 0.2 µm, to thus produce the organic anti-reflection coating composition C.

EXAMPLE 4

Production of Organic Anti-Reflection Coating Composition D 8 g of the polymer for organic anti-reflection coating produced in the Synthesis Example 1, 6 g of the light absorbent C produced in the Synthesis Example 5, 2.8 g of tetramethoxymethylglycoluril, and 0.54 g of a thermal acid generating agent having the structure of Formula 23 were dissolved in 982.66 g of propylene glycol monomethyl ether acetate, and then the solution was filtered through a membrane filter having a diameter of 0.2 µm, to thus produce the organic anti-reflection coating composition D.

EXAMPLE 5

Production of Organic Anti-Reflection Coating Composition E 8 g of the polymer for organic anti-reflection coating produced in the Synthesis Example 1, 4 g of the light absorbent D produced in the Synthesis Example 6, 1.7 g of tetramethoxymethylglycoluril, and 0.4 g of a thermal acid generating agent having the structure of Formula 23 were dissolved in 985.9 g of propylene glycol monomethyl ether acetate, and then the solution was filtered through a membrane filter having a diameter of 0.2 µm, to thus produce the organic anti-reflection coating composition E.

EXAMPLE 6

Production of Organic Anti-Reflection Coating Composition F 8 g of the polymer for organic anti-reflection coating produced in the Synthesis Example 1, 4 g of the light absorbent E produced in the Synthesis Example 7, 1.7 g of tetramethoxymethylglycoluril, and 0.4 g of a thermal acid generating agent having the structure of Formula 23 were dissolved in 985.9 g of propylene glycol monomethyl ether acetate, and then the solution was filtered through a membrane filter having a diameter of 0.2 µm, to thus produce the organic anti-reflection coating composition F.

EXAMPLE 7

Production of Organic Anti-Reflection Coating Composition G 5 g of the polymer for organic anti-reflection coating produced in the Synthesis Example 2, 5 g of the light absorbent E produced in the Synthesis Example 7, 1.4 g of tetramethoxymethylglycoluril, and 0.3 g of a thermal acid generating agent having the structure of Formula 23 were dissolved in 988.3 g of propylene glycol monomethyl ether acetate, and then the solution was filtered through a membrane filter having a diameter of 0.2 μm, to thus produce the organic anti-reflection coating composition G.

The composition ratios of the compositions of Examples 1 to 3 are collectively presented in Table 1.

TABLE 1

| | Light absorbent | Polymer | TMMG* | TAG* | (% by weight) PGMEA* | EL* |
|---|---|---|---|---|---|---|
| Example 1 | A 0.59 | 0.69 | 0.19 | 0.09 | 98.42 | — |
| Example 2 | A 0.80 | 0.70 | 0.21 | 0.10 | — | 98.19 |
| Example 3 | B 1.00 | 0.80 | 0.27 | 0.054 | 97.87 | — |
| Example 4 | C 0.60 | 0.80 | 0.28 | 0.054 | 98.26 | — |
| Example 5 | D 0.40 | 0.80 | 0.17 | 0.04 | 98.59 | — |
| Example 6 | E 0.40 | 0.80 | 0.17 | 0.04 | 98.59 | — |
| Example 7 | E .50 | 0.50 | 0.14 | 0.03 | 98.83 | — |

*TMMG: Tetramethoxymethylglycoluril, TAG: Thermal acid generating agent, PGMEA: Propylene glycol monomethyl ether acetate, EL: Ethyl lactate.

EXPERIMENTAL EXAMPLE

Stripping Test

Each of the organic anti-reflection coating compositions produced in the Examples 1 to 7 was spin coated on a silicon wafer, and then the composition was cross-linked by baking for 1 minute on a hot plate at 230° C., to form an organic anti-reflection coating. The thickness of the organic anti-reflection coating was measured, and the wafer coated with the organic anti-reflection coating was immersed in the solvent ethyl lactate for one minute. Then, ethyl lactate was completely removed, the wafer was baked for one minute on a hot plate at 100° C., and then the thickness of the organic ant-reflection coating was measured.

As a result of measurement, there was no change observed between the thickness of the coating obtained after the ethyl lactate treatment and the thickness before the treatment. Thus, it was confirmed that the organic anti-reflection coating composition produced in the above was completely cured during the baking process, and intermixing with photoresist or the like does not occur during the lithography process.

EXPERIMENTAL EXAMPLE

Measurement of Refractive Index (n) and Extinction Coefficient (k) Values

Each of the organic anti-reflection coating compositions produced in the Examples 1 to 7 was spin coated on a silicon wafer, and then the composition was cross-linked by baking for one minute on a hot plate at 230° C., to form an organic anti-reflection coating. The anti-reflection coating was subjected to measurement of the refractive index (n) and extinction coefficient (k) at 193 nm using a spectroscopic ellipsometer. As a result of the measurement, the refractive index (n) of the organic anti-reflection coating composition A was 1.66, and the extinction coefficient (k) was 0.32. The refractive index (n) of the organic anti-reflection coating composition B was 1.73, and the extinction coefficient (k) was 0.30. The refractive index (n) of the organic anti-reflection coating composition C was 1.78, and the extinction coefficient (k) was 0.32.

EXAMPLE 8

Patterning of Organic Anti-Reflection Coating and Photoresist

The organic anti-reflection coating composition produced in the Example 1 was spin coated on a silicon wafer on which silicon oxynitride has been deposited, and then the composition was cross-linked by baking for one minute on a hot plate at 230° C., to form an organic anti-reflection coating. Then, a photoresist manufactured by JSR Co., Ltd. was coated on top of the anti-reflection coating, and then the photoresist was baked for 90 seconds at 130° C. After conducting the baking, the assembly was exposed using an ASML 1400 scanner (0.85 NA) and a 80 nm 1:1 L/S pattern mask, and was baked again for 90 seconds at 130° C. The exposed wafer was developed using a developer containing 2.38% by weight of TMAH (tetra methyl ammonium hydroxide), and thus the final photoresist pattern could be obtained.

The photoresist pattern obtained using the organic ant-reflection coating composition A was a good perpendicular pattern, and the energy window was about 25%, while the depth of focus window was about 0.3 μm. The photoresist pattern obtained using the organic ant-reflection coating composition B was a good perpendicular pattern, and the energy window was about 23%, while the depth of focus window was about 0.3 μm. The photoresist pattern obtained using the organic ant-reflection coating composition C was a good perpendicular pattern, and the energy window was about 22%, while the depth of focus window was about 0.3 μm.

EXPERIMENTAL EXAMPLE

Measurement of Etching Rate

Each of the organic anti-reflection coating compositions produced in the above Examples was spin coated on a silicon wafer, and then the composition was cross-linked by baking for one minute on a hot plate at 230° C., to form an organic anti-reflection coating. The silicon wafer having the organic anti-reflection coating formed thereon was subjected to etching for 10 seconds using $CF_4$ gas in a dry etching apparatus. The etching rate was defined as (thickness of film before etching−thickness of film after etching)/time. This was converted with respect to dry etching selectivity, and as a result, the $CF_4$ gas etching rates of the organic anti-reflection coating compositions A, B and C were 2.25, 2.35 and 2.20, respectively. The dry etching selectivity represents the dry etching rate of the organic anti-reflection coating obtained when the dry etching rate of a photoresist for ArF lithography (manufactured by Kumho Petrochemical Co., Ltd., trade name KUPR-A60) was set as 1.00.

The results of the experimental examples of Examples 1 to 7 are collectively presented in Table 2.

TABLE 2

| | Stripping | Refractive index | Absorption coefficient | Energy window (%) | Focus window (μm) | Dry etching selectivity |
|---|---|---|---|---|---|---|
| Ex. 1 | Good | 1.77 | 0.44 | 25 | 0.3 | 2.25 |
| Ex. 2 | Good | 1.79 | 0.47 | 23 | 0.3 | 2.35 |
| Ex. 3 | Good | 1.65 | 0.32 | 22 | 0.3 | 2.20 |
| Ex. 4 | Good | 1.72 | 0.35 | 22 | 0.2 | 2.30 |
| Ex. 5 | Good | 1.68 | 0.30 | 22 | 0.3 | 2.28 |
| Ex. 6 | Good | 1.75 | 0.35 | 22 | 0.25 | 2.25 |
| Ex. 7 | Good | 1.78 | 0.39 | 21 | 0.25 | 2.20 |

It was confirmed that the etching rates of the thin films obtained from the organic anti-reflection coating composition of the present invention produced in Examples 1 to 7 were very high compared to photoresist. During the process of transferring the photoresist pattern formed on the organic anti-reflection coating onto a substrate, if the etching rate is high, the photoresist pattern can be transferred to a substrate more precisely and more easily.

What is claimed is:

1. An organic anti-reflection coating composition comprising a copolymer represented by the following Formula 1, a light absorbent, a thermal acid generating agent, and a curing agent

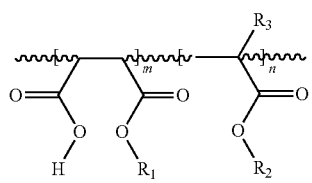

[Formula 1]

wherein $R_1$, $R_2$ and $R_3$ are each independent to each; $R_1$ represents hydrogen or an alkyl group having 1 to 10 carbon atoms, $R_2$ represents hydrogen, an alkyl group having 1 to 10 carbon atoms or an arylalkyl group having 1 to 20 carbon atoms; $R_3$ is hydrogen or a methyl group; m and n are repeating units in the main chain, while m+n=1, and they have values of 0.05<m/(m+n)<0.95 and 0.05<n/(m+n)<0.95.

2. The organic anti-reflection coating composition according to claim 1, wherein the light absorbent is the copolymer represented by the following Formula 8, and the weight average molecular weight is 1,000 to 100,000:

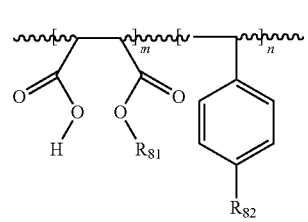

[Formula 8]

wherein $R_{81}$ represents an alkyl group having 1 to 10 carbon atoms, $R_{82}$ represents hydrogen, an hydroxyl group or an alkyl group having 1 to 10 carbon atoms; m and n are repeating units in the main chain, while m+n=1, and they have values of 0.05<m/(m+n)<0.95 and 0.05<n/(m+n)<0.95.

3. The organic anti-reflection coating composition according to claim 2, wherein the compound of Formula 8 is a light absorbent generated by reacting a copolymer of the following Formula 9 which is produced by polymerizing maleic anhydride and a styrene compound, with an alkyl alcohol having 1 to 10 carbon atoms:

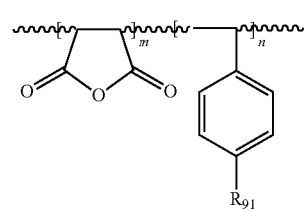

[Formula 9]

wherein $R_{91}$ is hydrogen, an hydroxyl group or an alkyl group having 1 to 10 carbon atoms; m and n are repeating units in the main chain, while m+n=1, and they have values of 0.05<m/(m+n)<0.95 and 0.05<n/(m+n)<0.95.

4. The organic anti-reflection coating composition according to claim 1, wherein the light absorbent is a compound represented by the following formula 14, 19 or 20:

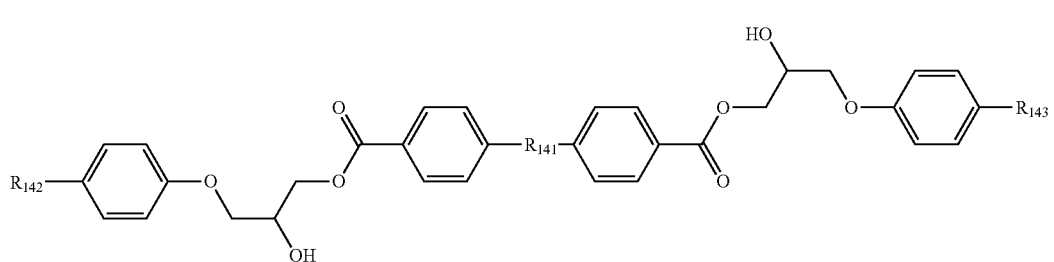

[Formula 14]

wherein $R_{141}$ is selected among

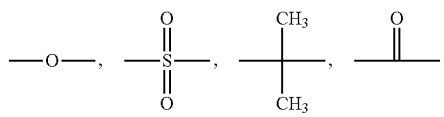

$R_{142}$ and $R_{143}$ represent each independent hydrogen, an alkyl group having 1~10 of carbon atoms or alkoxy group having 1~10 of carbon atoms

[Formula 19]

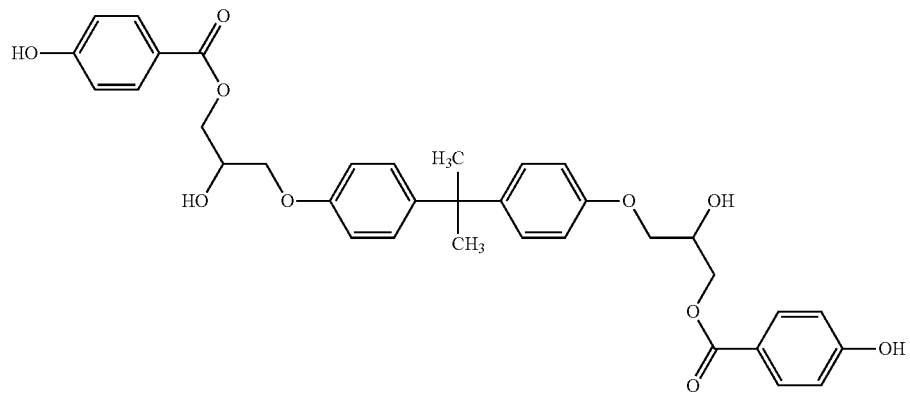

[Formula 20]

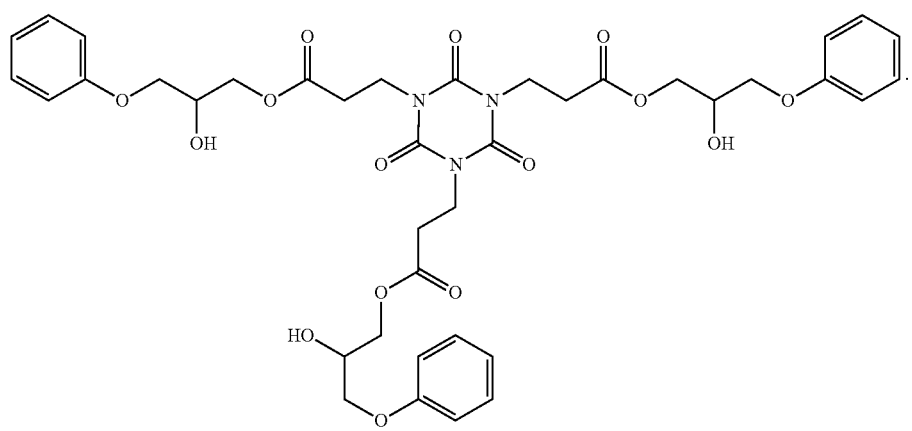

5. The organic anti-reflection coating composition according to claim 1, wherein the curing agent has two or more cross-linkable functional groups per compound and is selected from the group consisting of aminoplastic compounds, polyfunctional epoxy resins, anhydrides and mixtures thereof.

6. The organic anti-reflection coating composition according to claim 5, wherein the cross-linkable functional group is at least one selected from the group consisting of a methylol group, an alkoxymethyl group, an oxetanyl group, an oxazoline group, a cyclocarbonate group, an alkoxysilyl group, an aziridinyl group, an isocyanate group, an alkoxymethylamino group, aminomethylol group, and a polyfunctional epoxy group, all substituting the hydrogen atom on the amino group of a glycoluril compound, a urea compound, benzoguanamine compound, or a melamine compound.

7. The organic anti-reflection coating composition according to claim 1, wherein the thermal acid generating agent used is at least one selected from the group consisting of a compound of the following Formula 21 to 23

[Formula 21]

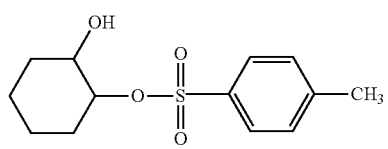

-continued

[Formula 22]

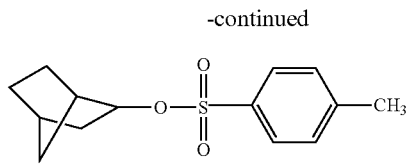

[Formula 23]

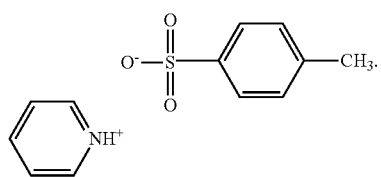

8. The organic anti-reflection coating composition according to claim 1, wherein the composition comprises at least one solvent selected from the group consisting of propylene glycol monomethyl ether (PGME), propylene glycol monomethyl ether acetate (PGMEA), cyclohexanone, ethyl lactate, propylene glycol n-propyl ether, dimethylformamide (DMF), gamma-butyrolactone, ethoxyethanol, methoxyethanol, methyl 3-methoxypropionate (MMP), and ethyl 3-ethoxypropionate (EEP).

9. The organic anti-reflection coating composition according to claim 1, wherein the composition comprises 0.1 to 40% by weight of the copolymer for organic anti-reflection coating, 0.1 to 40% by weight of the light absorbent, 0.01 to 20% by weight of the thermal acid generating agent, and 0.01 to 40% by weight of the curing agent.

10. The organic anti-reflection coating composition according to claim 1, wherein the copolymer of Formula 1 is a copolymer for organic anti-reflection coating generated by reacting a reaction intermediate of the following Formula 2 which is produced by polymerizing maleic anhydride and an alkyl acrylate compound, with an alkyl alcohol having 1 to 10 carbon atoms:

[Formula 2]

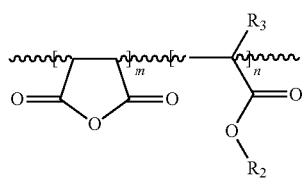

wherein $R_2$ and $R_3$ are each independent, $R_2$ is hydrogen, an alkyl group having 1 to 10 carbon atoms or an arylalkyl group having 1 to 20 carbon atoms; $R_3$ is hydrogen or a methyl group; m and n are repeating units in the main chain, while m+n=1, and they have values of $0.05<m/(m+n)<0.95$ and $0.05<n/(m+n)<0.95$.

11. The organic anti-reflection coating composition according to claim 10, wherein the alkyl acrylatepe compound is selected from the group consisting of methyl acrylate, ethyl acrylate, isopropyl acrylate, normal propyl acrylate, normal butyl acrylate, isobutyl acrylate, tert-butyl acrylate, cyclohexyl acrylate, isobornyl acrylate, 2-ethylhexyl acrylate, methyl methacrylate, ethyl methacrylate, isopropyl methacrylate, normal propyl methacrylate, tert-butyl methacrylate, normal butyl methacrylate, isobutyl methacrylate, cyclohexyl methacrylate, isobornyl methacrylate and 2-ethylhexyl methacrylate.

* * * * *